(12) United States Patent
Dominguez et al.

(10) Patent No.: US 8,482,444 B1
(45) Date of Patent: Jul. 9, 2013

(54) CALIBRATION OF ANALOG-TO-DIGITAL CONVERTER DATA CAPTURE

(75) Inventors: David C. Dominguez, Foothill Ranch, CA (US); Paul L. Deming, Aliso Viejo, CA (US)

(73) Assignee: The Boeing Company, Chicago, IL (US)

( * ) Notice: Subject to any disclaimer, the term of this patent is extended or adjusted under 35 U.S.C. 154(b) by 68 days.

(21) Appl. No.: 13/192,693

(22) Filed: Jul. 28, 2011

(51) Int. Cl.
*H03M 1/10* (2006.01)

(52) U.S. Cl.
USPC ............ 341/155; 341/120; 341/123; 341/132

(58) Field of Classification Search
USPC .................................. 341/120, 123, 132, 155
See application file for complete search history.

(56) References Cited

U.S. PATENT DOCUMENTS

| | | | | |
|---|---|---|---|---|
| 3,582,901 A * | 6/1971 | Cochrane et al. | ............. | 702/126 |
| 4,311,960 A * | 1/1982 | Barr | ............. | 324/103 P |
| 5,321,559 A * | 6/1994 | Nguyen et al. | ................. | 360/46 |
| 5,790,784 A * | 8/1998 | Beale et al. | .................... | 327/156 |
| 6,121,799 A * | 9/2000 | Moser | .............................. | 327/58 |
| 6,320,525 B1 | 11/2001 | Huang | | |
| 6,593,871 B1 * | 7/2003 | Miethig et al. | ................. | 341/155 |
| 6,624,777 B2 | 9/2003 | Miyano | | |
| 6,665,356 B1 * | 12/2003 | Goeddel et al. | ............... | 375/329 |
| 6,798,185 B2 | 9/2004 | Tanghe et al. | | |
| 7,738,565 B1 * | 6/2010 | Pogrebinsky et al. | ........ | 341/132 |
| 2012/0176261 A1 * | 7/2012 | Ishioka et al. | ................ | 341/123 |

FOREIGN PATENT DOCUMENTS

| | | |
|---|---|---|
| JP | 63142722 A | 9/1988 |
| JP | 2011040955 A | 2/2011 |

OTHER PUBLICATIONS

Great Britain Application No. GB1211694.3 Combined Search and Examination Report under Sections 17 and 18(3); Intellectual Property Office—The United Kingdom; Nov. 1, 2012.

* cited by examiner

*Primary Examiner* — Howard Williams
(74) *Attorney, Agent, or Firm* — Toler Law Group, P.C.

(57) ABSTRACT

A particular method includes calibrating data capture by a data register, where the data register receives a data signal from an analog-to-digital converter (ADC). The data capture may be calibrated by determining a peak value of a set of output values of the data register, where the peak value is determined in response to the ADC receiving a known input signal, and increasing a delay interval applied to registering of a value by the data register when the peak value satisfies a threshold.

20 Claims, 5 Drawing Sheets

CALIBRATION OF ANALOG-TO-DIGITAL CONVERTER DATA CAPTURE

FIELD OF THE DISCLOSURE

The present disclosure is generally related to capture of digital data converted from analog signals.

BACKGROUND

Sampling rates of analog-to-digital converters (ADC) are generally increasing. For example, as analog sensing equipment with increased resolution becomes available, ADC sampling rates may increase to handle greater quantities of data from the analog sensing equipment. At higher sampling rates (e.g., sampling rates of 200 MHz or more) capturing an output signal from an ADC at an appropriate time may be more important. For example, the ADC's output signal may change in response to an analog input signal and may be briefly unstable. Storing the ADC's output signals at an unstable period may result in storing inaccurate data values. For example, a data register may register an output of the ADC upon receiving a triggering edge (e.g., a leading edge or a trailing edge) of a clock signal. If the triggering edge of the clock signal is received when the output of the ADC is in transition, a data value registered at the data register may be skewed.

Sampling of the ADC's output signal may be manually tuned by examining registered data for potentially erroneous stored values. However, as sampling rates increase, stable intervals of the ADC output signal may decrease making manual tuning more difficult and more time consuming.

SUMMARY

Methods and systems that enable automatic calibration of data capture by a data register and that may reduce data errors resulting from transition of outputs of an analog-to-digital converter (ADC) are disclosed. The transition may result in a metastable logic condition. To avoid registering erroneous data values, particular embodiments of a digital processing device may be configured to selectively delay register data values by the data register until the data and clock relationship is out of the metastable logic condition. The ADC may be coupled to the digital processing device, and the digital processing device may include or be coupled to the data register.

To calibrate the data capture by the data register, the ADC may be provided a known input signal, which may cause the ADC to generate an expected output signal when sampled at stable points. The known input signal may be a null signal such that the expected output signal of the ADC includes expected noise values. Alternatively, the known input signal may be an oscillating signal, such as a clock signal or a sine wave signal. The oscillating signal may have a value (e.g., a peak or mid-scale value) that is known to be less than a threshold. A peak detector may be coupled to an output of the data register to detect a peak value of a set of output values of the data register. The peak value may be compared to a threshold that represents a maximum expected output value from the data register based on the known input signal applied to the ADC.

A delay interval may be automatically applied or automatically adjusted (e.g., increased or decreased) between output of an output signal of the ADC and registering of the data value by the data register. The delay interval may be selected or adjusted such that the peak value detected by the peak detector does not satisfy the threshold. For example, the delay may be modified incrementally until an absolute value of the peak value is less than a magnitude of the threshold. The delay interval may be applied (or adjusted) by introducing (or modifying) a delay upon receipt at the data register of the output signal of the ADC. Alternately or in addition, the delay interval may be applied (or adjusted) by introducing (or modifying) a delay upon receipt of the triggering edge of the clock signal by the data register.

In a particular embodiment, a method includes calibration of data capture by a data register. Calibrating the data capture may include receiving, at an input of the data register, a data signal from an ADC in response to the ADC receiving a known input signal. A value of the data signal may be registered at the data register to generate an output value. A peak value of multiple output values from the data register may be compared to a threshold. In response to determining that the peak value satisfies the threshold, a delay interval may be applied in the registering of data signals by the data register such that a subsequent output value corresponding to a subsequently registered value of the data signal does not satisfy the threshold.

In another particular embodiment, a method includes calibrating data capture by a data register, where the data register receives a data signal from an ADC. The data capture may be calibrated by determining a peak value of a set of output values of the data register, where the peak value is determined in response to the ADC receiving a known input signal, and increasing a delay interval applied to registering of a value of the data register when the peak value satisfies a threshold.

In yet another particular embodiment, an apparatus includes a data register, a peak detector and a delay controller. The data register is configured to receive an input from an analog-to-digital converter (ADC) and is configured to register output values based on the input. The peak detector is coupled to the data register and is configured to determine a peak value of a set of output values of the data register. The delay controller may be coupled to the peak detector and may be configured to receive the peak value and to compare the peak value to a threshold. In response to determining that the peak value satisfies the threshold, a delay interval in registering of the input by the data register may be applied or may be adjusted.

The features, functions, and advantages that are described can be achieved independently in various embodiments or may be combined in yet other embodiments, further details of which are disclosed with reference to the following description and drawings.

DETAILED DESCRIPTION

Methods and systems are disclosed that enable automatic calibration of data capture by a data register to reduce data errors resulting from transition of outputs of an analog-to-digital converter (ADC). For example, the data register may be configured to register a value of an output signal of the ADC received at an input of the data register upon receiving a triggering edge (e.g., a leading edge or a trailing edge) of a clock signal. If the triggering edge of the clock signal is received when the output signal of the ADC is in transition, the value registered at the data register may be skewed. In a particular embodiment, to avoid registering erroneous data values, a digital processing device coupled to or including the data register may be configured to selectively delay registering data values at the data register. For example, the digital processing device may cause the triggering edge of a clock pulse to be delayed. In another example, the digital processing device may cause the output signal of the ADC to be delayed. A peak detector may be coupled to an output of the data register. The peak detector may detect a peak value of a set of output values of the data register. The peak value may be compared to a threshold. The threshold may be predetermined or may be adaptive based on a maximum expected output value based on a known input signal applied to the ADC. The registering of values by the data register may be delayed such that a peak value of a subsequent set of output values of the data register does not satisfy the threshold.

Figure 1:
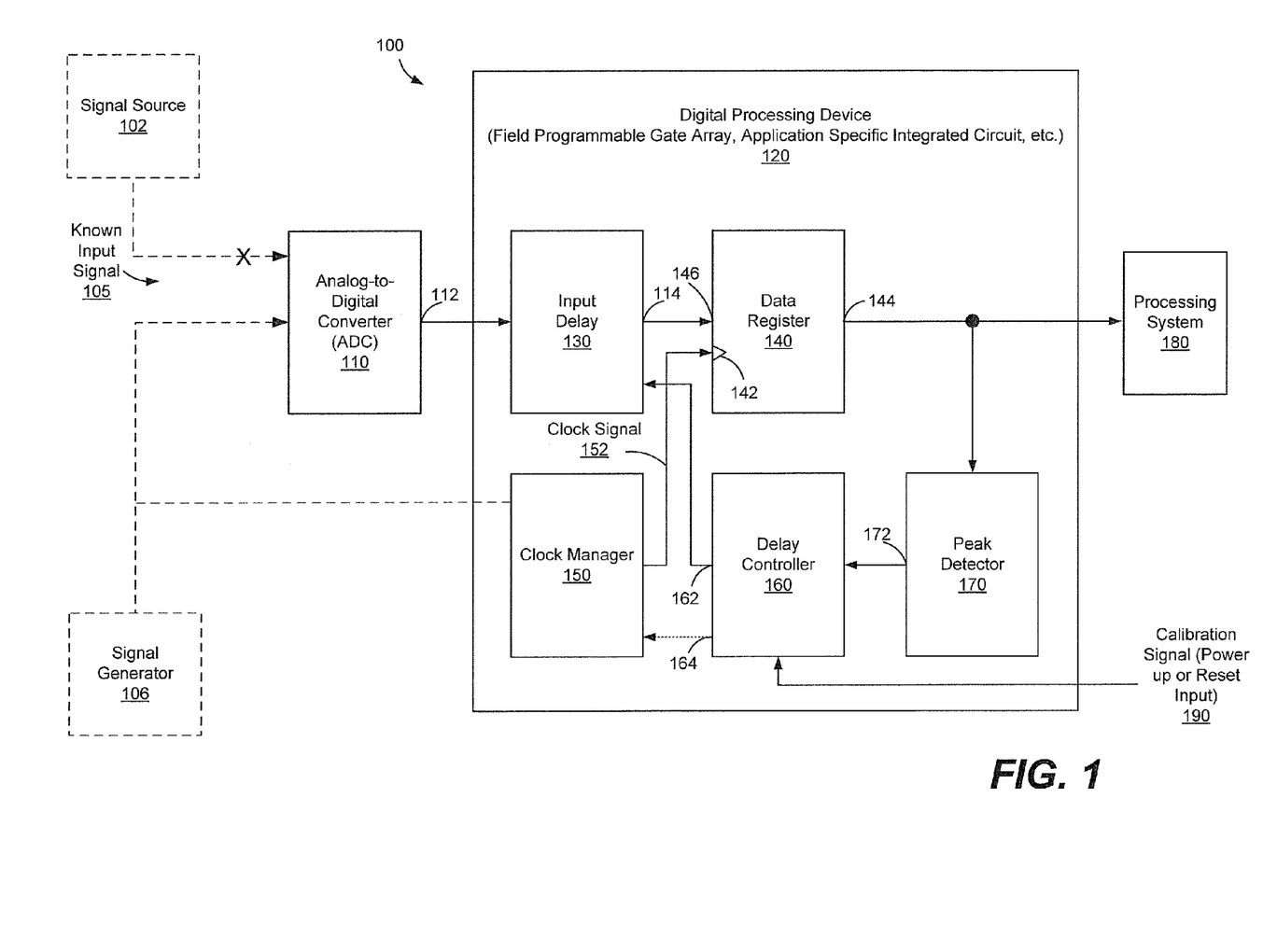
FIG. 1 is a block diagram of a first particular embodiment of a system including a digital processing device to calibrate sampling of analog-to-digital converter (ADC) output signals by a data register.

FIG. 1 is a block diagram of a first particular embodiment of a system 100 that includes a digital processing device 120 to calibrate sampling of analog-to-digital converter (ADC) 110 output signals by a data register 140. The digital processing device 120 may include or be coupled to the data register 140.

The digital processing device 120 may include an input delay 130, a clock manager 150, a delay controller 160, and a peak detector 170. An output 144 of the data register 140 may be coupled to a processing system 180. An output 112 (or outputs) of the ADC 110 may be coupled to the input delay 130. An output 114 (or outputs) of the input delay 130 may be coupled to an input 146 (or inputs) of the data register 140. A clock input 142 of the data register 140 may be coupled to the clock manager 150 to receive a clock signal 152. The output 144 (or outputs) of the data register 140 may be coupled to the peak detector 170. An output 172 of the peak detector 170 may be coupled to the delay controller 160. An output 162 of the delay controller 160 may be coupled to the input delay 130 to adjust an amount of the delay between the input signal 112 and the output signal 114.

The delay controller 160 may also receive a calibration signal 190. In a particular embodiment, calibration of data registering by the data register 140 is triggered or enabled in response receipt of the calibration signal 190. For example, the calibration signal 190 may be received in response to a system reset input, in response to a signal indicating power up of the system 100, or in response to another control signal.

To calibrate the data registering (i.e., registering of a value or values of a signal received from the ADC) of the data register 140, a known input signal 105 may be applied to the ADC 110. In a particular embodiment, the known input signal 105 is a null signal that is provided by decoupling the ADC 110 from a signal source 102. Thus, the known input signal 105 may be generated by thermal noise or other factors within or associated with the ADC 110. In another particular embodiment, the known input signal 105 may include a clock signal, such as the clock signal 152 or from a signal generator 106. The clock signal 152 may alternate between a low value and a high value, both of which have a known magnitude. In another particular embodiment, the known input signal 105 may include a sine wave signal or other oscillating signal generated by a signal source 102. The sine wave signal may have known maximum and minimum values (e.g., an expected high voltage value and an expected low voltage value).

The ADC 110 may generate an output signal based on the known input signal 105. The output signal of the ADC 110 may be received by the input delay 130 and may be presented to the data register 140 after a delay interval implemented by the input delay 130. Upon receipt of a triggering edge of the clock signal 152 (e.g., a leading edge or a trailing edge of the clock signal 152), the data register 140 may register a value of the output signal of the ADC 110 that is presented at the input 146 of the data register 140.

Figure 3:
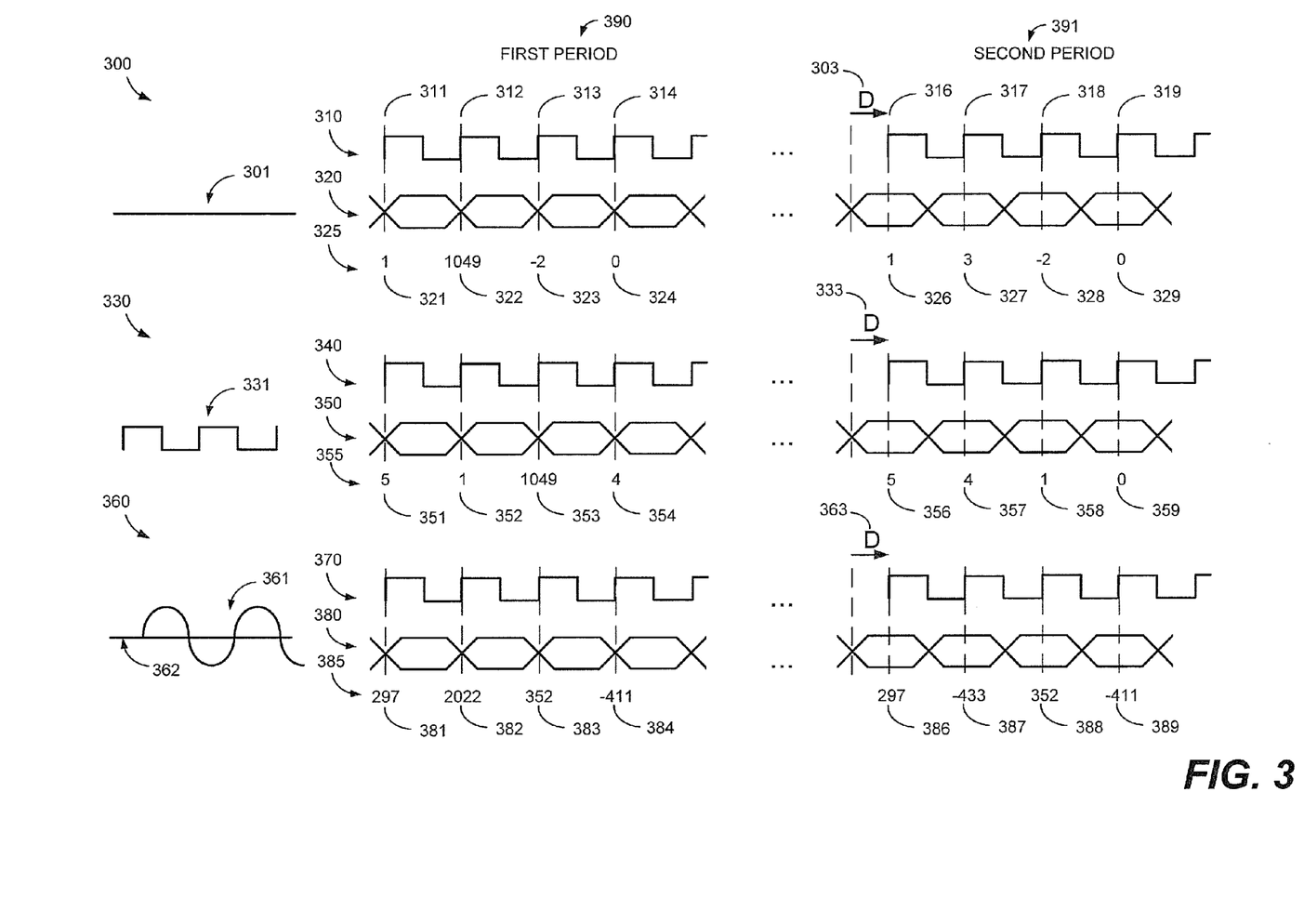
FIG. 3 is an illustration of a series of timing diagrams showing calibration of sampling of ADC output signals.

Multiple values that are registered by the data register 140 (e.g., over a period of time) may be presented to the peak detector 170. The peak detector 170 may identify a peak value of the multiple values. The peak value identified by the peak detector 170 may be compared to a threshold maintained by the delay controller 160 or the peak detector 170. The threshold may be based on expected peak values related to the known input signal 105. When the peak value satisfies the threshold (e.g., when the peak value has a magnitude that is greater than or equal to a magnitude of the threshold), registering of values by the data register 140 may be delayed. In the embodiment of FIG. 1, the delay controller 160 causes the input delay 130 to increase a delay interval applied to the output 112 of the ADC 110 before the output 112 of the ADC 110 is presented to the data register 140. When the delay controller 160 determines that the peak value does not satisfy the threshold (e.g., when the peak value has a magnitude that is less than the magnitude of the threshold), the digital processing device 120 is determined to be calibrated, and the delay interval applied by the input delay 130 is maintained at its current level. The system 100 may exit a calibration mode. Alternately, the system 100 may perform the calibration again using another known input signal. For example, the ADC 110 may be coupled to the signal source 102 to generate an output responsive to a signal provided by the signal source 102, and data values registered by the data register 140 (subject to the delay imposed by the input delay 130) may be presented to the processing system 180 for processing. Additionally, the delay controller 160 may adjust the delay for input delay 130 in order to capture data at a center of a data eye (as shown in FIG. 3) for data register 140.

In a particular embodiment, a second output 164 of the delay controller 160 may be coupled to the clock manager 150. In this embodiment, the clock manager 150 may control when the triggering edge of the clock signal 152 is received by the data register 140 to adjust timing of registering data values. Thus, the input delay 130 may be used to control timing of provision of the input 145 to the data register 140 and the clock manager 150 may be used to control timing of provision of the triggering edge of the clock signal 152. For example, the input delay 130 may be used as to provide a coarse adjustment of timing of registering data values and the clock manager 150 may be used to provide a fine adjustment of the timing. Alternately, the clock manager 150 may provide the coarse adjustment and the input delay 130 may provide the fine adjustment of the timing of registering data values.

Figure 2:
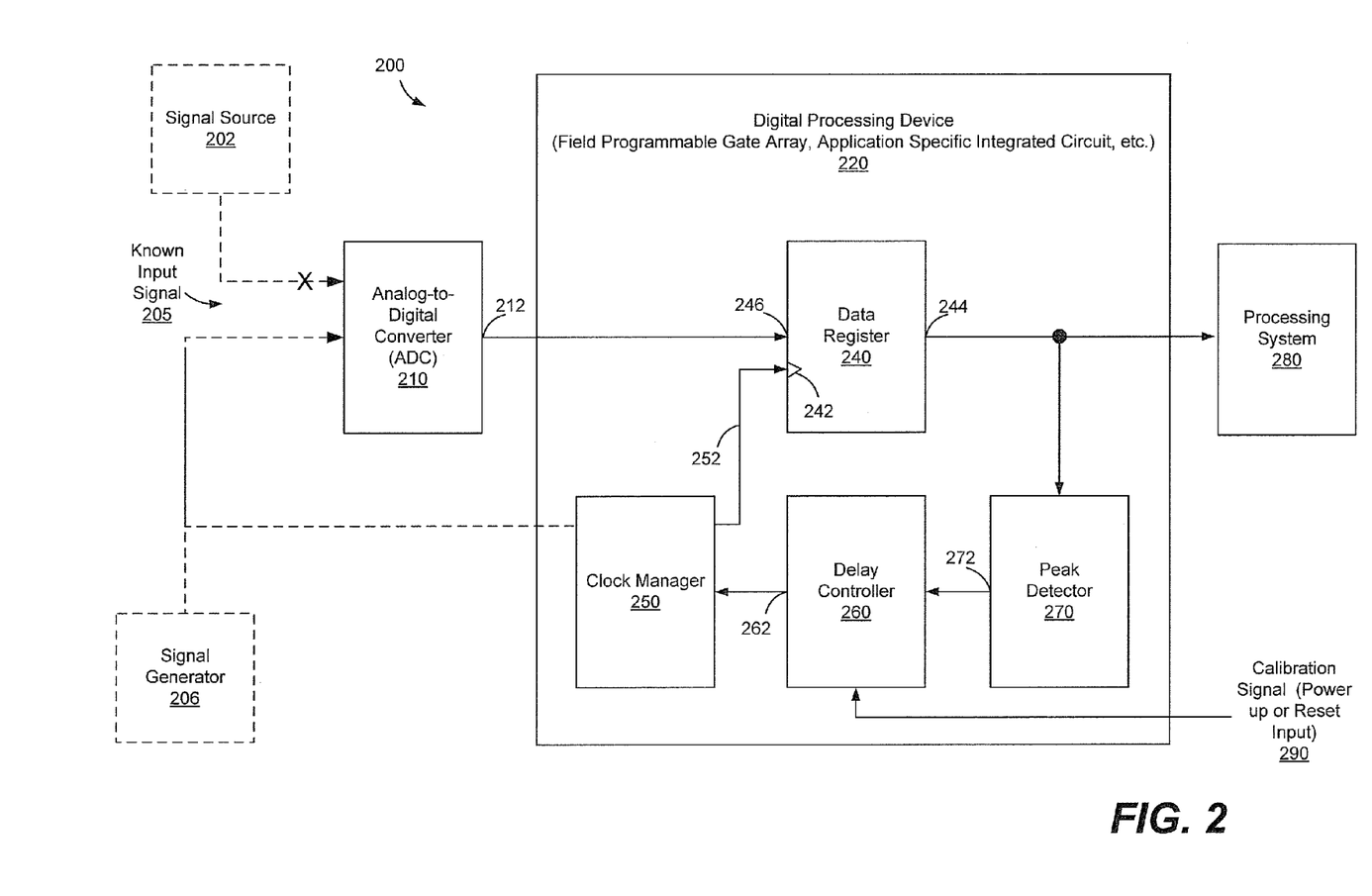
FIG. 2 is a block diagram of second particular embodiment of a system including a digital processing device to calibrate sampling of analog-to-digital converter (ADC) output signals by a data register.

FIG. 2 is a block diagram of a second particular embodiment of a system 200 that includes a digital processing device 220 to calibrate sampling of analog-to-digital converter (ADC) 210 output signals by a data register 240. The digital processing device 220 may include or be coupled to the data register 240.

The digital processing device 220 may include a clock manager 250, a delay controller 260, and a peak detector 270. An output 244 of the data register 240 may be coupled to a processing system 280. An output 212 (or outputs) of the ADC 210 may be coupled to an input 246 (or inputs) of the data register 240. A clock input 242 of the data register 240 may be coupled to the clock manager 250 to receive a clock signal 252. The output 244 (or outputs) of the data register 240 may be coupled to the peak detector 270. An output 272 of the peak detector 270 may be coupled to the delay controller 260. An output 262 of the delay controller 260 may be coupled to the clock manager 250.

In a particular embodiment, calibration of the data registering is triggered in response receipt of a calibration signal 290. For example, the calibration signal 290 may be received in response to a system reset input, in response to a signal indicating power up of the system 200, or in response to another control signal.

To calibrate data registering (i.e., registering of a value or values of a signal received from the ADC) by the data register 240, a known input signal 205 may be provided to the ADC 210. In a particular embodiment, the known input signal 205 is a null signal that is provided by decoupling the ADC 210 from a signal source 202. Thus, the known input signal 205 may be generated by thermal noise or other factors within or associated with the ADC 210. In another particular embodiment, the known input signal 205 may include a clock signal, such as the clock signal 252 or from the signal generator 206. The clock signal 252 may alternate between a low value and a high value, both of which have a known magnitude. In another particular embodiment, the known input signal 205 may include a sine wave signal or other oscillating signal generated by a signal generator 206 or by the signal source 202. The sine wave signal may have known expected values (e.g., a known maximum and a known minimum).

The ADC 210 may generate an output signal based on the known input signal 205. The output signal of the ADC 210 may be received by the data register 240. Upon receipt of a triggering edge of the clock signal 252 (e.g., a leading edge or a trailing edge of the clock signal 152), the data register 240 may register a value of the output signal of the ADC 210 that is presented at the input 246 of the data register 240. The clock manager 250 may control when the triggering edge of the clock signal 252 is received by the data register 240 to adjust timing of registering of data values. In a particular embodiment, the clock manager 250 is a source of the clock signal 252. In another particular embodiment, the clock manager 250 receives the clock signal 252 from another clock source (not shown) and regulates provision of the clock signal 252 to the data register 240.

Multiple values that are registered by the data register 240 (e.g., over a period of time) may be presented to the peak detector 270. The peak detector 270 may identify a peak value of the multiple values. The peak value identified by the peak detector 270 may be compared to a threshold (e.g., a threshold or an adaptive threshold) maintained by the delay controller 260 or the peak detector 270. The threshold may be based on expected peak values related to the known input signal 205. When the peak value satisfies the threshold (e.g., when the peak value has a magnitude that is greater than or equal to a magnitude of the threshold), registering of values by the data register 240 may be delayed. In the embodiment of FIG. 2, the delay controller 260 may cause the clock manager 250 to delay generation of the triggering edge of the clock signal 252 to delay when a value of the output signal of the ADC 210 is registered by the data register 240. When the delay controller 260 determines that the peak value identified by the peak detector 270 does not satisfy the threshold (e.g., has a magnitude that is less than the magnitude of the threshold), the digital processing device 220 is determined to be calibrated (or calibrated with respect to the known input signal 205 and may be calibrated for another known input). The delay interval applied by the clock manager 250 to the triggering edge of the clock signal 252 is maintained at its current level. The system 200 may exit a calibration mode. For example, the ADC 210 may be coupled to the signal source 202 to generate an output responsive to a signal provided by the signal source 202, and data values registered by the data register 240 (subject to the delay imposed by the clock manager 250) may be presented to the processing system 280 for processing. Additionally, the delay controller 260 may adjust the delay for clock manager 250 in order to capture data at a center of a data eye for data register 240.

FIG. 3 is a set of timing diagrams 300, 330, and 360 illustrating calibration of sampling of values of output signals from an Analog-to-Digital Converter (ADC), such as the ADC 110 of FIG. 1 or the ADC 210 of FIG. 2. Each of the timing diagrams 300, 330 and 360 is divided into a first period 390 and a second period 391, which is subsequent to the first period 390. The first period 390 and the second period 391 may correspond to operation of a device in a calibration mode, while a known input signal 301, 331, 361 is received by the ADC.

Each of the timing diagrams 300, 330, and 360 includes a trace corresponding to a clock signal 310, 340, and 370 and a trace corresponding to output 320, 350, and 380 of the ADC in response to one of the known input signals 301, 331, 361. The timing diagrams 300, 330 and 360 also show values 325, 355 and 385 that are registered by a data register, such as the data register 140 of FIG. 1 or the data register 240 of FIG. 2, in response to receipt of the corresponding output 320, 350 and 380 of the ADC and a triggering edge of the corresponding clock signal 310, 340 and 370. The triggering edge of the clock signals 310, 340, and 370 may be a trailing edge or a leading edge.

Calibration of registering of values by the data register may be achieved by causing a shift of the timing of receipt by the data register of the output 320, 350, or 380 of the ADC relative to the triggering edge of the clock signal 310, 340, 370. For example, the calibration may be achieved by adjusting a delay in presenting the output 320, 350, or 380 of the ADC to the data register (e.g., as in FIG. 1). In another example, the calibration may be achieved by adjusting a delay in presenting the triggering edge of the clock signal 310, 340 or 370 to the data register (e.g., as in FIG. 2). In FIG. 3, a delay ("D") 303, 333, 363 is shown to illustrate shifting the timing. Thus, in one embodiment, the delays 303, 333, 363 are applied to the clock signals 310, 340, 370, and in another embodiment, the delays 303, 333, 363 are applied to the outputs 320, 350 and 380.

A first timing diagram 300 illustrates an example of calibrating the registering of data signals by presenting a known null input signal 301 to the ADC. The known null input signal 301 may be presented by disconnecting the ADC from another signal source. Thus, the output 320 of the ADC may be generated by thermal noise resulting from operating the ADC. In this example, the output 320 of the ADC may be expected to have a relatively low magnitude. Thus, when the data register registers a particular value that exceeds a threshold, this may be an indication that the particular value was registered at a time when the output 320 of the ADC was in transition or unstable (e.g., in a metastable logic condition).

In the first timing diagram 300, the values 325 registered by the data register include a first value 321 of 1 registered at a first triggering edge 311, a second value 322 of 1049 registered at a second triggering edge 312, a third value 323 of −2 registered at a third triggering edge 313, and a fourth value 324 of 0 registered at a fourth triggering edge 314. A peak value among a set of the values 321-324 may be identified by a peak detector, such as the peak detector 170 of FIG. 1 or the peak detector 270 of FIG. 2. For example, among the values 321-324, the second value 322 (i.e., 1049) is the peak value. The peak value may be compared to a threshold. The threshold may be selected based on expected output values associated with the known null input signal 301. For example, since the output 320 is expected to have relatively low magnitude, the value may be relatively low as well. For purposes of this description and as a non-limiting example for explanation purposes, the threshold may be set at 8. Because the peak value (i.e., the second value 322) exceeds the threshold, a delay 303 may be applied in registering a value of the output 320 as illustrated in the second period 391.

After the delay 303 is applied, subsequent values 326-329 of the output 320 may be registered. For example, a fifth value 326 of 1 may be registered at a fifth triggering edge 316, a sixth value 327 of 3 may be registered at a sixth triggering edge 317, a seventh value 328 of −2 may be registered at a seventh triggering edge 318, and an eighth value 329 of 0 may be registered at an eighth triggering edge 319. A peak value among a set of the subsequent values 326-329 may be identified by the peak detector. For example, the sixth value 327 (i.e., 3) may be the peak value among the subsequent values 326-329. The sixth value 327 does not satisfy the threshold. For example, a magnitude of the sixth value 327 may be less than a magnitude of the threshold. Thus, the subsequent values 326-329 may be presumed to be registered (without skew or other transition errors) when the output 320 of the ADC is stable as a result of the delay 303. Accordingly, the calibration may be considered complete, in which case a calibration mode may be exited. Alternately, the calibration may be performed again using another known input signal 331 or 361.

A second timing diagram 330 illustrates an example of calibrating the registering of data signals by presenting a known oscillating input signal, such as a clock signal 331 to the ADC. The clock signal 331 may alternate between a known low value and a known high value. In this example, the output 350 of the ADC may be expected to be between the known low value and the known high value of the clock signal 331. To illustrate, the clock signal 331 may alternate between direct current levels, including a high voltage value and a low voltage value (e.g., zero or some offset or minimum voltage). The threshold may correspond to the direct current voltage level of the high voltage of the clock signal. When the data register registers a particular value that exceeds the threshold, this may be an indication that the particular value was registered at a time when the output 350 of the ADC was in transition or unstable.

In the second timing diagram 330, the values 355 registered by the data register include a first value 351, a second value 352, a third value 353, and a fourth value 354. A peak value among a set of the values 351-354 may be identified by the peak detector. For example, the third value 353 may be the peak value. The peak value may be compared to a threshold. The threshold may be selected based on expected output values associated with the clock signal 331. For example, since the clock signal 331 has a known high value and a known low value, the threshold may correspond to a magnitude of the known high value, a magnitude of the known low value, a magnitude of a difference between the known high value and the known low value, or another value selected based on the known high value and the known low value. For purposes of this description and as a non-limiting example for explanation purposes, the threshold may be set at 8. Because the peak value (i.e., the third value 353) exceeds the threshold, a delay 333 may be applied in registering values of the output 350 as illustrated in the second period 391.

After the delay 333 is applied, subsequent values 356-359 of the output 350 may be registered. For example, a fifth value 356, a sixth value 357, a seventh value 358, and an eighth value 359 may be registered. A peak value among a set of the subsequent values 356-359 may be identified by the peak detector. For example, the fifth value 356 may be the peak value. The fifth value 356 does not satisfy the threshold. For example, a magnitude of the fifth value 356 may be less than a magnitude of the threshold. Thus, the subsequent values 356-359 may be presumed to be registered (without skew or other transition errors) when the output 350 of the ADC is stable as a result of the delay 333. Accordingly, the calibration may be considered complete, in which case the calibration mode may be exited. Alternately, the calibration may be performed again using another known input signal 301 or 361.

A third timing diagram 360 illustrates an example of calibrating the registering of data signals by presenting a known input signal to the ADC. In particular, the known input signal may be a sine wave signal 361. The sine wave signal 361 may oscillate between known expected values about a mid-scale value 362. In this example, the output 380 of the ADC may be expected to be between a known low value and a known high value of the clock signal 361. When the data register registers a particular value that exceeds a threshold (which may be set based on the known low value, the known high value, the mid-scale value 362 or a combination thereof), this may be an indication that the particular value was registered at a time when the output 380 of the ADC was in transition or unstable.

In the third timing diagram 360, the values 385 registered by the data register include a first value 381, a second value 382, a third value 383, and a fourth value 384. A peak value among a set of the values 381-384 may be identified by the peak detector. For example, the second value 382 may be the peak value. The peak value may be compared to the threshold. The threshold may be selected based on expected output values associated with the sine wave signal 361. For example, since the sine wave signal 361 has the known high value, the known low value, and the mid-scale value 362, the threshold may correspond to a magnitude of the known high value, a magnitude of the known low value, a magnitude of a difference between the known high value and the known low value, a difference between the mid-scale value 362 and the known high value or the known low value, or another value selected based on the known high value, the known low value, or the mid-scale value 362. For purposes of this description and as a non-limiting example for explanation purposes, the threshold may be set at 500. Because the peak value (i.e., the second value 382) exceeds the threshold, a delay 363 may be applied in registering a value of the output 380 as illustrated in the second period 391.

After the delay 363 is applied, subsequent values 386-389 of the output 380 may be registered. For example, a fifth value 386, a sixth value 387, a seventh value 388, and an eighth value 389 may be registered. A peak value among a set of the subsequent values 386-389 may be identified by the peak detector. For example, the sixth value 387 may be the peak value. The sixth value 387 does not satisfy the threshold. For example, a magnitude (or absolute value) of the sixth value 387 may be less than a magnitude of the threshold. Thus, the subsequent values 387-389 may be presumed to be registered when the output 380 of the ADC is stable as a result of the delay 363. Accordingly, the calibration may be considered complete, in which case the calibration mode may be exited. Alternately, the calibration may be performed again using another known input signal 301 or 331.

Figure 4:
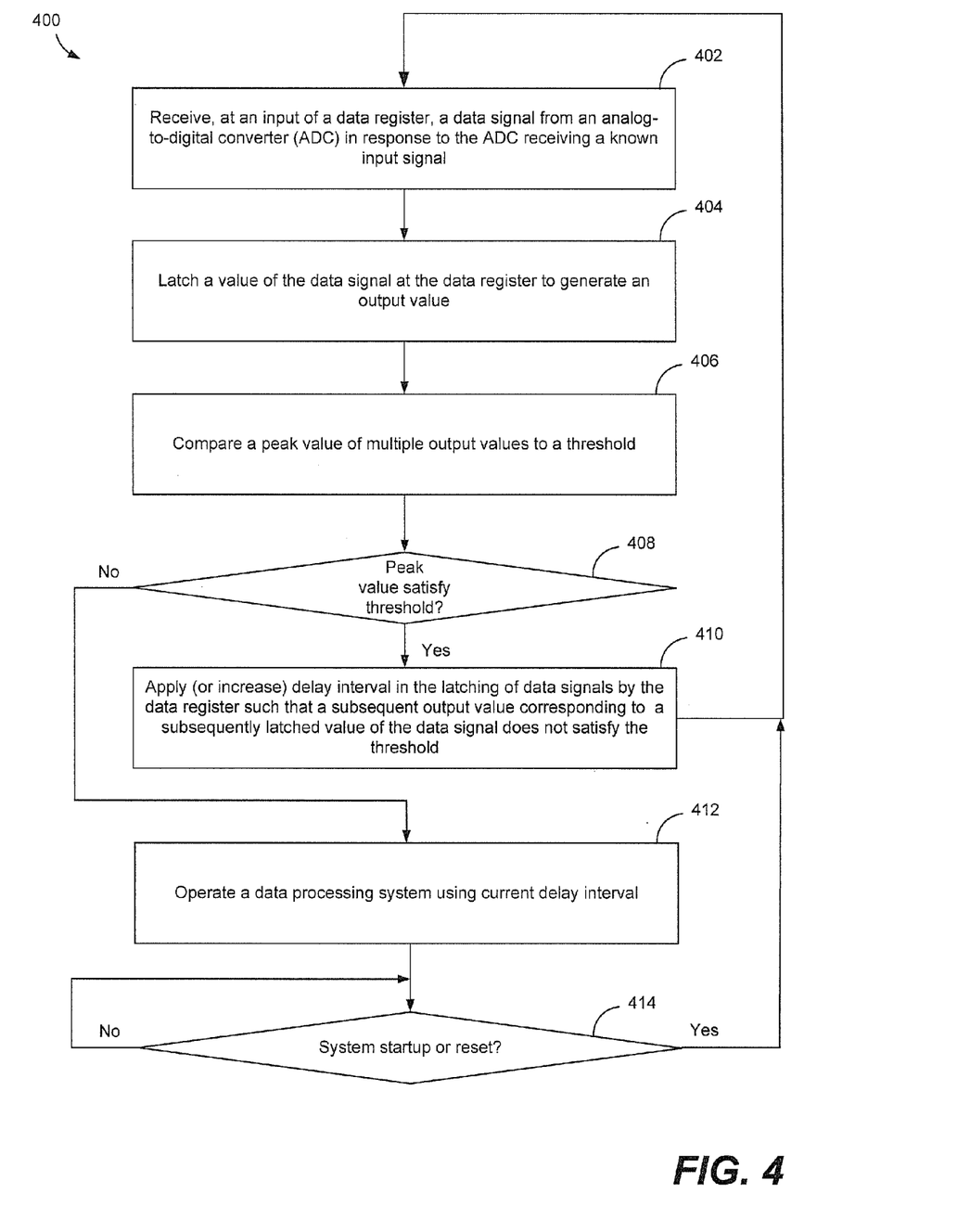
FIG. 4 is a flow diagram of a first particular embodiment of a method of calibrating sampling of ADC output signals.

FIG. 4 is a flow diagram of a first particular embodiment of a method 400 of calibrating sampling of ADC output signals. The method 400 includes receiving a data signal at an input of a data register, at 402. The data signal is received from an analog-to-digital converter (ADC) in response to the ADC receiving a known input signal. For example, the data register may be the data register 140 of FIG. 1, and the data signal may correspond to the output 112 of the ADC 110. In another example, the data register may be the data register 240 of FIG. 2, and the data signal may correspond to the output 212 of the ADC 210. In still another example, the data signal may correspond to one of the outputs 320, 350, 380 of FIG. 3.

A value of the data signal may be registered at the data register to generate an output signal, at 404. A peak value of multiple output values may be determined, e.g., by the peak detector 170 of FIG. 1 or by the peak detector 270 of FIG. 2. The peak value may be compared to a threshold, at 406. A determination may be made, at 408, whether the peak value satisfies the threshold. For example, the peak value may satisfy the threshold (depending on how the threshold is specified) when an absolute value of the peak value is greater than the threshold, when an absolute value of the peak value is greater than or equal to the threshold, when an absolute value of the peak value is less than the threshold, or when an absolute value of the peak value is less than or equal to the threshold.

When the peak value satisfies the threshold, a delay interval may be applied or adjusted (e.g., increased) in the registering of the data signals by the data register, at 410. For example, the delay interval may be applied or adjusted such that a subsequent output value corresponding to a subsequently registered value (e.g., a peak value of a set of subsequently registered values) of the data signal does not satisfy the threshold. To illustrate, the delay interval may be applied or adjusted by delaying presentation of the output signal from the ADC to the data register, e.g., using the input delay 130 of FIG. 1. Alternatively or in addition, the delay interval may be applied or adjusted by delaying presentation of a triggering edge of a clock signal to the data register, e.g., using the clock manager 250 of FIG. 2. After applying or adjusting the delay interval, the method 400 may be repeated to determine whether a detected peak value of a subsequent set of registered output values satisfies the threshold. If a subsequently detected peak value satisfies the threshold, the method 400 may again apply or increase the delay interval and repeat iteratively until the detected peak value of a subsequent set of registered output values does not satisfy the threshold.

At 408, when the peak value does satisfy the threshold, a data processing system may be operated using the calibrated delay interval, at 412. As previously explained, when the registered data signal does not satisfy the threshold, it is assumed that the ADC outputs are being registered at a stable point, and no change to the delay interval is needed. Thus, a calibration mode can be exited and operation of the data processing system can proceed. The data processing system may operate outside the calibration mode until it is determined that a system startup or reset has occurred, at 414. When a startup or reset occurs, the data processing system may enter the calibration mode and the method 400 may be repeated.

Figure 5:
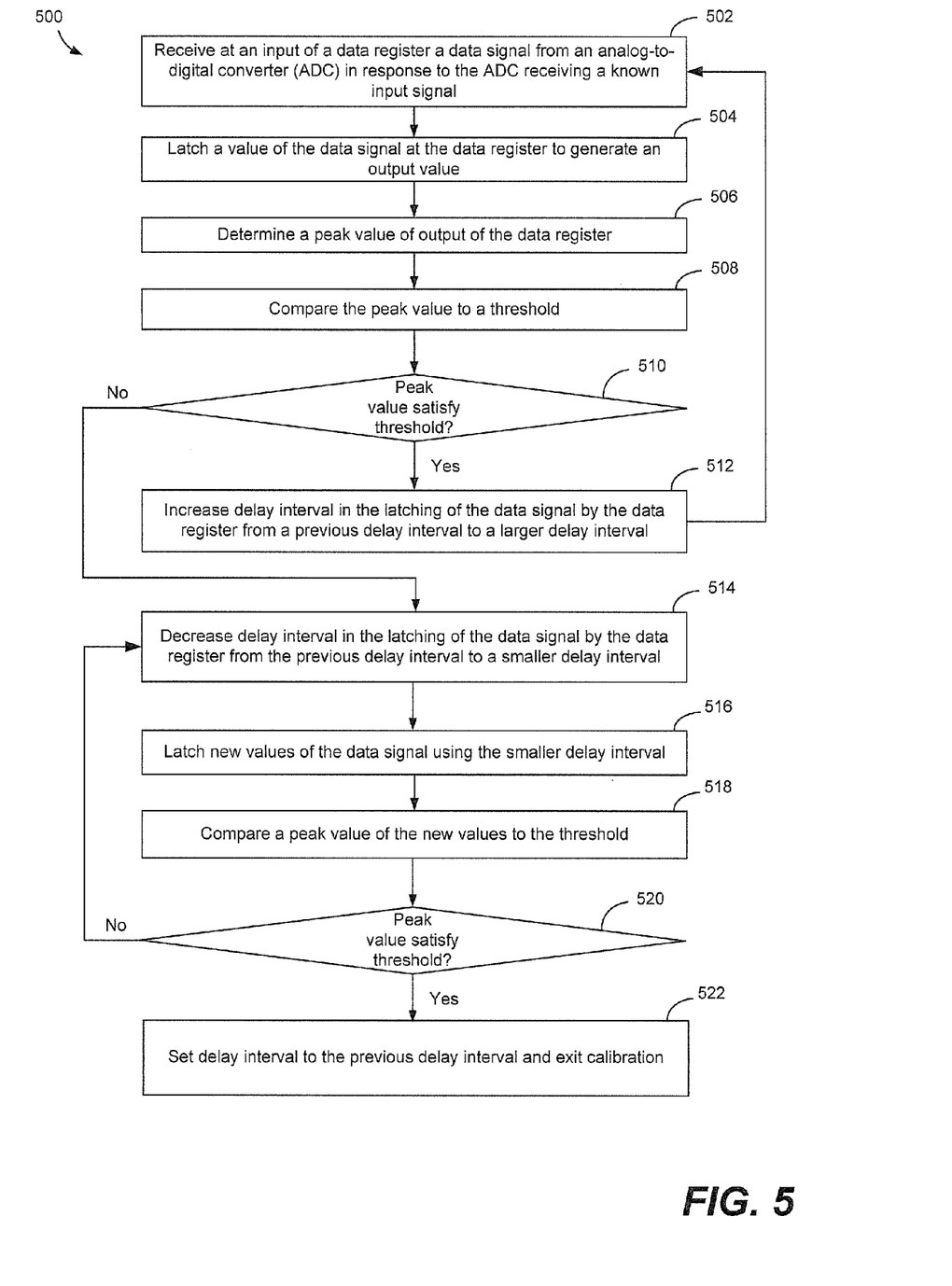
FIG. 5 is a flow diagram of second particular embodiment of a method of calibrating sampling of ADC output signals.

FIG. 5 is a flow diagram of second particular embodiment of a method 500 of calibrating sampling of ADC output signals. The method 500 includes receiving a data signal at an input of a data register, at 502. The data signal is received from an analog-to-digital converter (ADC) in response to the ADC receiving a known input signal. For example, the data register may be the data register 140 of FIG. 1, and the data signal may correspond to the output 112 of the ADC 110. In another example, the data register may be the data register 240 of FIG. 2, and the data signal may correspond to the output 212 of the ADC 210. In still another example, the data signal may correspond to one of the outputs 320, 350, 380 of FIG. 3.

A value of the data signal may be registered at the data register to generate an output signal, at 504. A peak value of output of the data register may be determined, at 506. The peak value may correspond to a value with a largest magnitude among a set of values. The peak value may be determined by a peak detector, such as the peak detector 170 of FIG. 1 or the peak detector 270 of FIG. 2.

The peak value may be compared to a threshold, at 508, to determine whether the peak value satisfies the threshold, at 510. Whether the peak value satisfies the threshold may be determined by a delay controller, such as the delay controller 160 of FIG. 1 or the delay controller 260 of FIG. 2.

When the peak value satisfies the threshold, a delay interval in the registering of the data signal by the data register may be increased from a previous delay interval (which may be zero) to a larger delay interval, at 512. The delay interval may be increased by a predetermined amount (i.e., incremented). The delay interval may be increased by delaying presentation of the ADC output to the data register by the input delay, as in FIG. 1. Alternatively or in addition, the delay interval may be increased by delaying presentation of a clock signal by a clock manager, as in FIGS. 1 and 2. After increasing the delay interval, the method 500 may receive and register subsequent values of the ADC output using the larger delay interval and then compare peak values of the subsequent values to the threshold.

When the peak value does not satisfy the threshold, at 510, the delay interval in the registering of the data signal may be decreased from the previous delay interval to a smaller delay interval, at 514. The delay interval may be decreased by a predetermined amount (i.e., decremented). The delay interval may be decreased by reducing the delay in presentation of the ADC output to the data register by the input delay, as in FIG. 1. Alternatively or in addition, the delay interval may be decreased by reducing the delay in presentation of the clock signal by the clock manager, as in FIGS. 1 and 2. After the delay interval is decreased, at 514, new values of the data signal may be registered using the smaller delay interval, at 516. A peak value of the new values may be compared to the threshold, at 518.

A determination may be made, at 520, whether the peak value of the new values satisfies the threshold. When the peak value does not satisfy the threshold, the delay interval may be decreased further, at 514. That is, the delay interval may be decremented from a previous value (e.g., the smaller delay interval) to a next value (e.g., an even smaller delay interval), and another peak value of the output of the data register may be determined. When the peak value satisfies the threshold, the delay interval may be set to the previous delay interval and the method may exit calibration, at 522.

Thus, the method 500 enables automatic calibration of data capture by a data register. Calibration using the method 500 may reduce data errors resulting from transitions of the output of the ADC. To avoid registering erroneous data values, particular embodiments of a digital processing system may be configured to selectively delay registering of data values by the data register subject to a delay interval. Using the method 500, the delay interval that is used to calibrate a data processing system, such as the system 100 of FIG. 1 or the system 200 of FIG. 2, may be reduced. That is, the method 500 may set the delay interval to a smallest value that is identified as yielding a peak registered value that does not satisfy the threshold. Additionally, the method 500 allows capturing ADC data in a center of a data eye.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to more or less than all of the features of any of the disclosed embodiments.

What is claimed is:

1. A method comprising:
    calibrating data capture by a data register, wherein calibrating the data capture includes:
        receiving, at an input of the data register, a data signal from an analog-to-digital converter (ADC) in response to the ADC receiving a known input signal;
        registering a value of the data signal at the data register to generate an output value;
        comparing a peak value of multiple output values from the data register to a threshold; and
        in response to determining that the peak value satisfies the threshold, applying a delay interval in registering of data signals by the data register such that a subsequent output value corresponding to a subsequently registered value of the data signal does not satisfy the threshold.

2. The method of claim 1, wherein the known input signal received by the ADC includes a null signal, and wherein the threshold is predetermined based on an expected peak value of noise responsive to the null signal.

3. The method of claim 1, wherein the known input signal received by the ADC includes a sine wave signal and the threshold corresponds to an expected value of the sine wave signal.

4. The method of claim 3, wherein the threshold corresponds to a mid-scale value of the sine wave signal.

5. The method of claim 1, further comprising a clock source, wherein a clock signal generated by the clock source is used to trigger the registering of the value of the data signal.

6. The method of claim 5, wherein the known input signal is the clock signal and wherein the threshold corresponds to a direct current voltage level of a high voltage of the clock signal.

7. The method of claim 1, wherein applying the delay interval includes delaying presentation of a subsequent portion of the data signal to the input of the data register.

8. The method of claim 1, wherein applying the delay interval includes delaying presentation of a clock signal to the data register, wherein the clock signal triggers the registering of the value of the data signal at the data register.

9. The method of claim 1, wherein the data capture is calibrated in response to startup of a system including the data register.

10. The method of claim 1, further comprising receiving a reset signal, wherein the data capture is calibrated in response to the reset signal.

11. A method comprising:
    calibrating data capture by a data register that receives a data signal from an analog-to-digital converter (ADC) by:
        determining a peak value of a set of output values of the data register, wherein the peak value is determined in response to the ADC receiving a known input signal; and
        when the peak value satisfies a threshold, increasing a delay interval applied to registering of a value by the data register.

12. The method of claim 11, further comprising:
    in response to determining that the peak value does not satisfy the threshold:
        decreasing the delay interval from a previous value to a next value;
        determining a second peak value of a set of outputs of the data register; and
        in response to determining that the second peak value satisfies the threshold, setting the delay interval to the previous value.

13. The method of claim 12, wherein the delay interval is increased or decreased by a predetermined amount.

14. The method of claim 11, wherein the ADC is decoupled from a signal source and the known input signal received by the ADC includes a null signal.

15. The method of claim 14, wherein the null signal corresponds to thermal noise generated by the ADC when the ADC is decoupled from the signal source.

16. The method of claim 11, wherein the data capture by the data register is calibrated in response to a startup of a system including the data register.

17. An apparatus comprising:
    a data register configured to receive an input from an analog-to-digital converter (ADC) and to register output values based on the input;
    a peak detector coupled to the data register and configured to determine a peak value of a set of output values of the data register; and
    a delay controller coupled to the peak detector and configured to:
        receive the peak value;
        compare the peak value to a threshold; and
        in response to determining that the peak value satisfies the threshold, apply a delay interval in registering of the input by the data register.

18. The apparatus of claim 17, wherein the input is receive from the ADC in response to the ADC receiving a null signal.

19. The apparatus of claim 17, further comprising an input delay that implements a delay between an output of the ADC and receipt of the input at the data register, wherein the delay controller applies the delay interval by adjusting the delay implemented by the input delay.

20. The apparatus of claim 17, further comprising a clock manager that provides a clock signal to the data register, wherein the clock signal triggers registering of the input from the ADC at the data register to generate the output values, and wherein the clock signal is provided to the ADC to generate the input to the data register.

* * * * *